United States Patent
Lichtensteiger (10) Patent No.: US 9,754,810 B2
(45) Date of Patent: Sep. 5, 2017

(54) METHOD FOR THE PRODUCTION OF A WAFER WITH A CARRIER UNIT

(71) Applicant: Siltectra GmbH, Dresden (DE)

(72) Inventor: Lukas Lichtensteiger, Zurich (CH)

(73) Assignee: Siltectra GmbH, Dresden (DE)

( * ) Notice: Subject to any disclaimer, the term of this patent is extended or adjusted under 35 U.S.C. 154(b) by 0 days.

(21) Appl. No.: 14/888,927

(22) PCT Filed: May 5, 2014

(86) PCT No.: PCT/EP2014/059101
§ 371 (c)(1),
(2) Date: Nov. 3, 2015

(87) PCT Pub. No.: WO2014/177716
PCT Pub. Date: Nov. 6, 2014

(65) Prior Publication Data
US 2016/0086839 A1 Mar. 24, 2016

(30) Foreign Application Priority Data
May 3, 2013 (DE) .......................... 10 2013 007 671

(51) Int. Cl.
*H01L 21/00* (2006.01)
*H01L 21/683* (2006.01)
(Continued)

(52) U.S. Cl.
CPC .......... *H01L 21/6835* (2013.01); *B32B 15/08* (2013.01); *B32B 27/283* (2013.01);
(Continued)

(58) Field of Classification Search
CPC ........... H01L 21/6835; H01L 21/02002; B32B 27/283
See application file for complete search history.

(56) References Cited

U.S. PATENT DOCUMENTS

| 4,582,559 A * | 4/1986 | Tanielian ................ C30B 23/02 117/915 |
| 7,999,355 B2 * | 8/2011 | Weigel .................. C23C 18/122 106/287.11 |
| 2010/0289189 A1 * | 11/2010 | Lichtensteiger .. H01L 21/76251 264/492 |

FOREIGN PATENT DOCUMENTS

EP 1858087 11/2007

OTHER PUBLICATIONS

English translation of Written Opinion of the International Searching Authority for corresponding PCT application PCT/EP2014/059101, published Mar. 11, 2005.

* cited by examiner

*Primary Examiner* — Bradley K Smith
(74) *Attorney, Agent, or Firm* — Great Lakes Intellectual Property, PLLC.

(57) ABSTRACT

The invention relates to a method for the production of layers of solid material, in particular for use as wafers, comprising the following steps: providing a workpiece for the separation of layers of solid material, the workpiece having at least one exposed surface, producing and/or providing a carrier unit for receiving at least one layer of solid material, the carrier unit being made in a number of layers, the carrier unit having a stabilisation layer and the stabilisation layer being overlapped at least partially by a receiving layer, the receiving layer being made to hold the layer of solid material, and the stabilisation layer being formed, at least partially, such that it has an E modulus that is greater than the E modulus of the receiving layer, connecting the receiving layer to the exposed surface of the workpiece, thus forming a composite structure, exposing the composite structure to an inner and/or outer stress field such that the (Continued)

layer of solid material is separated along a plane of the workpiece extending within the workpiece.

14 Claims, 3 Drawing Sheets

(51) Int. Cl.
    *H01L 21/304*      (2006.01)
    *H01L 21/02*      (2006.01)
    *B32B 15/08*      (2006.01)
    *B32B 27/28*      (2006.01)
    *B32B 37/18*      (2006.01)
    *B32B 38/10*      (2006.01)
    *B32B 43/00*      (2006.01)

(52) U.S. Cl.
    CPC .............. *B32B 37/18* (2013.01); *B32B 38/10* (2013.01); *B32B 43/006* (2013.01); *H01L 21/0201* (2013.01); *H01L 21/02002* (2013.01); *H01L 21/304* (2013.01); *B32B 2311/00* (2013.01); *B32B 2383/00* (2013.01); *B32B 2457/14* (2013.01); *H01L 2221/68345* (2013.01); *H01L 2221/68381* (2013.01)

METHOD FOR THE PRODUCTION OF A WAFER WITH A CARRIER UNIT

TECHNICAL FIELD

In accordance with the claims, the present invention relates to a method for the production of layers of solid material, to a device for the production of layers of solid material, to a carrier unit for receiving at least one layer of solid material, and to a correspondingly produced wafer.

BACKGROUND

In many technical domains (e.g. microelectronic or photovoltaic technology) materials, such as e.g. silicon, germanium or sapphire, are often needed in the form of thin discs and plates (so-called wafers). As standard, such wafers are currently produced by sawing from an ingot, relatively large material losses ("kerf loss") occurring. Since the source material used is often very expensive, great efforts are being made to produce such wafers with less material consumption and so more efficiently and inexpensively.

For example, with the currently normal methods almost 50% of the material used is lost as "kerf loss" when producing silicon wafers for solar cells alone. Considered globally, this corresponds to an annual loss of more than 2 billion euros. Since the cost of the wafer makes up the greatest percentage of the cost of the finished solar cell (over 40%), the cost of solar cells could be significantly reduced by making appropriate improvements to the wafer production.

Methods which dispense with the conventional sawing and can separate thin wafers directly from a thicker workpiece, e.g. by using temperature-induced stresses, appear to be particularly attractive for this type of wafer production without kerf loss ("kerf-free wafering"). These include in particular methods as described e.g. in PCT/US2008/012140 and PCT/EP2009/067539 where a polymer layer applied to the workpiece is used in order to produce these stresses.

In the aforementioned methods the polymer layer has a thermal expansion coefficient that is higher by approximately two orders of magnitude in comparison to the workpiece. Moreover, by utilising a glass transition a relatively high elasticity modulus can be achieved in the polymer layer so that sufficiently large stresses can be induced in the polymer layer workpiece layer system by cooling in order to enable the separation of the wafer from the workpiece.

Upon separating a wafer from the workpiece, in the aforementioned methods polymer still adheres to a respective side of the wafer. The wafer bends here very strongly towards this polymer layer, and this makes it difficult to execute the separation in a controlled manner, and may lead e.g. to variations in the thickness of the separated wafer. Moreover, the strong curvature makes subsequent processing difficult and may even lead to the wafer shattering.

When using the methods according to the previous prior art, the wafers produced generally have respectively larger thickness variations, the spatial thickness distribution often showing a pattern with four-fold symmetry. The total thickness variation seen over the entire wafer ("total thickness variation", TTV) is often more than 100% of the average wafer thickness when using the previous methods (a wafer with an average thickness of, for example, 100 micrometers, that is e.g. 50 micrometers thick at its thinnest point and 170 micrometers thick at its thickest point has a TTV of 170-50=120 micrometers, which corresponds to a total thickness variation of 120% relative to its average thickness). Wafers with these strong thickness variations are unsuitable for many applications and the thickness variations lead to problems or losses in efficiency due to uneven contact when subsequently processing the wafer. Moreover, with the most frequently occurring four-fold thickness distribution patterns, the regions with the greatest variations unfortunately lie in the middle of the wafer where they cause the greatest disruption.

Moreover, in the method according to the current prior art, undesirable oscillations in the layer systems involved occur during the break propagation when the separation itself is taking place, and these oscillations have a negative impact upon the development of the break front and may in particular lead to significant thickness variations of the separated wafer.

In addition, with the previous methods it is difficult to ensure reproducibly good heat contact over the entire surface of the polymer layer. Locally insufficient heat contact may, however, lead to undesirable significant local temperature variations in the layer system due to the low thermal conductivity of the polymers used, and this on its part has a negative impact upon the controllability of the stress fields produced and so upon the quality of the wafers produced.

Finally, there is also a requirement for a method in which the coated workpieces can easily be mechanically fixed during the cooling process (optionally also exerting external forces to additionally affect the separation process), and where the wafers are easy to handle after separation. According to the current prior art many wafers shatter after separation because the relatively heavy polymer layer adhering to the wafer becomes soft after heating and so can no longer support the brittle, thin wafer sufficiently.

SUMMARY

It is therefore the object of the present invention to provide an appropriate method, an appropriate device and an appropriate apparatus for the production of layers of solid material and/or plates of solid material which improve the quality of the wafers produced in comparison to the known methods, in particular by the curvature of the separated wafers being reduced and an even layer thickness of the wafer being produced. Additional objects of the present invention are to reduce the undesirable oscillations that occur during the break propagation, to improve the heat contact with the layer system and additionally to enable simpler and gentler handling of the layers and/or plates of solid material after separation. Furthermore, a wafer should be produced such that the aforementioned disadvantages are overcome during its production.

This aforementioned object is achieved by a method for the production of layers of solid material and/or plates, in particular for use as wafers, according to Claim 1.

This method comprises at least the following steps: providing a workpiece for the separation of the layers of solid material, the workpiece having at least one exposed surface, producing and/or providing a carrier unit for receiving at least one layer of solid material, the carrier unit being made in a number of layers, the carrier unit having a stabilisation layer and the stabilisation layer being overlapped at least partially by a receiving layer, the receiving layer being made to hold the layer of solid material, and the stabilisation layer being formed, at least partially, such that it has an E modulus that is greater than the E modulus of the receiving layer, and connecting the receiving layer to the exposed surface of the workpiece, thus forming a composite structure or a laminate, and exposing the composite structure to an inner and/or outer stress field such that the layer of solid material is separated along a plane of the workpiece extending within the workpiece.

Additional advantageous configurations of the invention are the subject matter of the sub-claims.

According to one preferred embodiment of the present invention the receiving layer and the stabilisation layer are made of different materials, the receiving layer preferably comprising a polymer, in particular polydimethylsiloxanes (PDMS), and the stabilisation layer preferably comprising a metal, in particular aluminium.

The receiving layer is preferably formed by at least one polymer, the at least one polymer or the polymer produced from a number of materials preferably being made or at least partially formed from one or more duroplasts and/or from one or more elastomers and/or from one or more thermoplasts and/or from one or more thermoplastic elastomers. The polymer thus preferably comprises at least one plastic, in particular at least one elastomer, in particular at least one silicone, in particular at least one RTV silicone and/or at least one HTV silicone, in particular at least one polydimethysiloxane (PDMS) or is preferably made of at least one plastic, in particular at least one elastomer, in particular at least one silicone, in particular at least one RTV silicone and/or at least one HTV silicone, in particular at least one polydimethylsiloxane (PDMS). Thus, a polydiorganosiloxane, for example, can particularly preferably be used as a polymer, e.g. polydimethylsiloxanes (PDMS). In the following a film made of PDMS is preferably used as the polymer layer or receiving layer.

With the present invention, i.e. in particular by using polymer/metal laminates as layer systems for generating thermally induced mechanical stress fields, all of the aforementioned problems and restrictions are eliminated. In the examples of use described here, a thicker wafer from which one or more thinner wafers are then separated using the described method is preferably used as the workpiece.

This embodiment is advantageous because it makes it possible to greatly reduce the thickness variations by using layers of appropriately configured polymer/metal laminates instead of the pure polymer layers used according to the previous prior art. These layers consist e.g. of alternating layers of polymer and a metal, e.g. aluminium, the innermost layer, i.e. the layer lying closest to the wafer surface and generating mechanical stress, in each case preferably always being made of polymer. With the corresponding methods according to the invention described below, layers of solid material, such as in particular wafers, can be produced with far smaller total thickness variations (wafers with thickness variations<40% of the average wafer thickness have already been checked experimentally in this way), more advantageous linear patterns being able to be achieved as regards spatial thickness distribution, and in particular the regions with the greatest variations being able to be adjusted, such as e.g. being able to be brought close to the wafer edge where they are less disruptive.

In examples of use where the outermost layer of the laminate (i.e. the one furthest away from the wafer surface) is preferably made of metal, as a result of the good head conductivity of metals this has the additional advantage that very good thermal contact with the laminate is possible over this layer, and this enables efficient, locally well controllable and reproducible cooling of the laminate. Moreover, a metal layer or metal plate can generally be fastened more easily to a machine than the polymer layers used, and this facilitates the automated (subsequent) processing of the wafers. In addition, this fastening enables external mechanical forces to also be able to be exerted upon the laminate/wafer composite in a controlled manner by means of a machine, e.g. during the cooling process, by means of which the separation process can be further influenced. In particular, it is conceivable for the thickness of the wafers produced to be able to be influenced by the externally exerted forces as well as by the rigidity (elasticity modulus) of the layers involved, and all of these parameters can be controlled well and largely independently of one another when using the laminates according to the invention in large areas.

As an example, a polydiorganosiloxane, e.g. polydimethylsiloxanes (PDMS), can be used as the polymer. In the following a film made of PDMS is described as the polymer layer or as the receiving layer, and a wafer, in particular a thick wafer made of silicon, is described as the workpiece; however, other suitable polymers and workpieces (e.g. made of other materials such as gallium arsenide, germanium, gallium nitride, silicon carbide, sapphire etc.) can also be used.

According to another preferred embodiment of the present invention the E modulus of the material of the stabilisation layer is substantially, exactly or at least twice as great as the E modulus of the material of the receiving layer.

This embodiment is advantageous because a laminate is thus created that uses layers (in particular the stabilisation layer/s), in particular made of metal/s, which have a substantially (at least, precisely or approx. one or two or more orders of magnitude) greater elasticity modulus than the receiving layer/s, in particular the polymer, and this leads to overall substantially more rigid layers than when using pure polymer layers. In this way undesirable oscillations during the break propagation can be damped and the strong curvature of the wafer following separation can be reduced, by means of which the thickness variations in the wafers produced are reduced. Since the innermost layer of the laminate towards the wafer is still made of polymer, the advantages of the polymer (e.g. a very high thermal expansion coefficient, very slight contamination, etc.) can nevertheless be successfully used.

According to another embodiment of the present invention, the receiving layer and the stabilisation layer are connected to one another, firmly bonded, to form the carrier unit, and in particular the receiving layer is produced as a film, and preferably as a ready-made film, and is adhered to the stabilisation layer.

The advantage of this is that the production and qualification of the polymer layers, in particular the receiving layer/s, and/or of one or more possible connection layer/s can take place independently of the production of the layers of solid material or the wafer production. In other words: the properties of the individual polymer layers can thus be defined and controlled independently of other procedural steps. Specifically, for example, structured films can also be used where e.g. the film thickness is specifically varied depending on the position so that polymer layers with defined thickness profiles are possible.

PDMS can preferably be used to produce the polymer films. This is a two-component mixture that is cured thermally (e.g. mix ratios between curing agents: base material of preferably 1:100 to 1:1 and particularly preferably of 1:30 to 1:3). Temperatures from ambient temperature up to approx. 300° C. and preferably up to 200° C., preferably from ambient temperature up to approx. 120° C., can be allowed for for curing—depending on the curing time. Preferably, curing times of between approx. 1-120 minutes (at high temperatures) and 1-6 days (at ambient temperature)

can be allowed for. Before curing, PDMS is a viscous liquid that is applied to a preferably smooth surface (e.g. a mirror) e.g. by means of a casting process and is cured here to form a film. The film is then removed from this surface (e.g. mechanically), is optionally processed further and is then applied to the surface to be coated. Moreover, the finished film can already be inspected prior to application and its quality can be checked (e.g. using normal mechanical, optical or electrical measuring methods, etc.). In addition to the method described here for the production of the film, many other methods are commonly used in the industry (e.g. production by means of extrusion) which can also be used for the present invention.

According to another preferred embodiment of the present invention the receiving layer is connected to the stabilisation layer by means of an adhesive layer, plasma-activated adhesion or lamination.

Following its production, a first film or receiving layer is thus adhered to the surface of a level metal plate or stabilisation layer. In the following a plate made of aluminium is described as the metal plate; however, plates made of other suitable materials (e.g. brass, steel, silicon etc.) can also be used. Good adhesion of this first film to the metal plate is important here: the connection between the metal plate and the film must be able to withstand sufficiently large shearing forces for the separation and sufficiently large temperature variations for the thermal induction of the required stresses. The adhesion can be improved e.g. by mechanically roughening the metal surface, anodizing the aluminium, cauterizing processes, etc.

A thin PDMS film, for example, can be used as an adhesive for adhering the first film or the receiving layer. In this example the PDMS is applied thinly (a few milliliters for a 6 inch wafer) in the liquid state to both surfaces to be adhered. Then the film is placed over the metal plate and pressed on with a roller or cylinder applying slight pressure. By moving the roller to and fro the adhesive film is distributed beneath the film and air bubbles are removed. The adhesive can cure e.g. at temperatures between ambient temperature and approx. 200° C. The curing times vary dependently upon the curing temperature as with film production (see above). Alternatively to the method described, the film or the receiving layer can also be adhered to the metal plate or the stabilisation layer using other conventional methods, for example using a vacuum laminator.

Finally, the film can also be connected preferably directly (without adhesive) to the surface of the metal plate, e.g. by means of "plasma activated bonding" (e.g. activation of the PDMS film in nitrogen plasma, pressing the film onto the metal plate, optionally "annealing") or e.g. by the lamination (melting on) of a thermoplastic film (e.g. Geniomer von Wacker silicones).

After adhering the receiving layer or the first polymer film to the stabilisation layer or the metal plate and the curing of the adhesive, the workpiece (in the present example a thick silicon wafer) is preferably adhered to the receiving layer or the first polymer film by means of a method that is preferably similar.

According to another preferred embodiment of the present invention the receiving layer is structured. This embodiment is advantageous because in this way specifically structured films can also be used, the foil thickness, for example, being specifically varied depending on the position so that one or more polymer layer/s with defined thickness profiles are possible, by means of which locally definable control of the thickness variations of the wafer produced is possible.

According to another preferred embodiment of the present invention the receiving layer is formed by applying an at least occasionally pourable material onto the stabilisation layer and by solidifying, in particular curing, the material.

Within the framework of an alternative process it is also possible with this example of use to adhere one or more of the polymer layers used (receiving layer/s and/or connection layer/s) not as a ready-made film, but to produce it/them directly in situ. The receiving layer or first polymer layer can thus be produced, for example, as follows: A predetermined amount of liquid PDMS is applied to the stabilisation layer, in particular a metal plate. The stabilisation layer or the metal plate is horizontally aligned here such that the PDMS runs evenly or substantially evenly as a result of the force of gravity and forms a layer of constant or substantially constant thickness. Overflowing at the edges can be prevented by an appropriate shuttering device or e.g. by the surface tension of the PDMS itself. In a final step, this liquid PDMS layer is cured directly on the metal plate, and so separate adhesion is not necessary.

According to another preferred embodiment of the present invention the workpiece is brought into contact with the material before the material solidifies, the workpiece being immersed at least partially in the material.

According to this exemplary embodiment one can thus advantageously entirely dispense with the adhesion of ready-made polymer films. Here, as described above, a liquid material, in particular a liquid polymer, such as preferably PDMS, is applied directly to the metal plate, the latter preferably being aligned horizontally and preferably being provided at the edges with an appropriate limitation (shuttering) which particularly preferably prevents the PDMS from overflowing. One thus produces a type of basin filled with liquid PDMS. The workpiece (the wafer) is preferably moistened on all sides with a thin layer of liquid PDMS and is then dipped into the basin, in particular a PDMS basin, with liquid material (prior moistening with PDMS reduces the formation of air bubbles on the wafer surface). Due to the force of gravity the workpiece or the wafer sinks to the bottom of the basin where it comes to rest a small distance away from the surface of the stabilisation layer or the metal plate.

According to another preferred embodiment of the present invention the immersion depth can be adjusted, in particular by increasing the normal force exerted upon the carrier unit by the workpiece or by introducing spacers.

This embodiment is advantageous because the distance can be adjusted such that the workpiece can be appropriately coupled or operatively connected to the stabilisation layer by means of the receiving layer.

The distance between the workpiece or the wafer surface and the stabilisation layer or the metal plate is preferably determined by the equilibrium between the force of gravity/impetus of the wafer and the surface tension of the PDMS on the wafer and metal surface. This distance can be reduced by artificially increasing the force of gravity (e.g. by means of a centrifuge) or can be increased by adapting preferably thin mechanical spacers, which can themselves preferably be made of a polymer, and in particular PDMS, or comprise a polymer, in particular PDMS, between the workpiece or the wafer and the stabilisation layer or the metal plate. This distance preferably determines the thickness of the first polymer layer (between the metal plate and the wafer), and the thickness of the second polymer layer (on the opposite side of the wafer) is preferably determined by the amount of PDMS in the basin. Next the PDMS is cured, and then, as already described with regard to a previously described embodiment, the lateral edges of the polymers layers are preferably trimmed a defined distance away from the workpiece edge or wafer edge, for example flush with the workpiece edge or wafer edge.

In one of the exemplary embodiments the laminate can alternatively or additionally be produced by adhering ready-made metal and polymer layers or stabilisation and receiving layers. After adhering the first polymer film to the metal plate and curing the adhesive, the workpiece (in the present example a thick silicon wafer) is adhered to the first polymer film by means of a similar method, and then—once again using a similar method—a second generally or substantially thicker polymer film is adhered to the side of the wafer which is still free. Finally, in the present example the lateral edges of all of the polymer films are trimmed so that they end flush with the wafer edge.

In another example the receiving layer can in each case be poured directly between the stabilisation layer or the metal layer and the workpiece or the wafer, and so no specific adhesion step is required.

According to another preferred embodiment of the present invention, a connection layer, in particular comprising a polymer and preferably polydimethylsiloxanes (PDMS), is applied to the workpiece, the connection layer being arranged substantially parallel to the receiving layer, and the portions of the connection layer and the receiving layer that are substantially parallel to one another being spaced apart from one another by the workpiece extending in between. This embodiment is advantageous because, by means of the connection layer, at least one further layer, in particular made of material or silicon, or a stabilisation layer, can be provided.

The exemplary embodiments described above preferably use an asymmetrical layer system consisting of metal/polymer/wafer/polymer, the polymer layer (i.e. the receiving layer) between the metal and the wafer being substantially thinner than the polymer layer (i.e. the connection layer) on the opposite side of the wafer. Needless to say, the present method can however also be used with different layer systems, and in particular symmetrical layer systems consisting of metal/polymer/wafer/polymer/metal and metal/polymer/wafer/polymer/wafer/polymer/metal, have already been successfully tested.

Preferably, independently of the respective exemplary embodiment or the respective embodiment it is the case that the required thicknesses and material properties (in particular elasticity moduli) of the receiving layer/s used, in particular polymer layer/s, and of the stabilisation layer/s, in particular the metal plate/s, depend upon the thicknesses and material properties of the workpiece and the desired target thickness of the layer of solid material to be separated, in particular the wafer. With the examples of use described here, a 400 micrometer thick, monocrystalline, pseudo-quadratic 6-inch silicon wafer with <100> orientation is split in half into two 200 micrometer thick wafers. The layers in the laminate used for this purpose preferably have the following thicknesses: The stabilisation layer, in particular in the form of a metal plate, is preferably made of aluminium or particularly preferably comprises aluminium and is preferably between 0.1 and 10 mm, in particular between 0.5 and 5 mm thick, the receiving layer, in particular a first polymer layer (between the metal plate and the workpiece), is preferably between 0.01 and 2 mm, in particular between 0.02 and 1 mm thick, and a connection layer, in particular second polymer layer, is preferably between 0.1 and 20 mm, in particular between 0.2 and 10 mm thick. The lateral dimensions of the polymer layers preferably correspond respectively to those of the wafer, the edges particularly preferably lying one over the other flush with the wafer edge. The lateral dimensions of the metal plate are preferably somewhat larger so that the latter protrudes e.g. approx. 1 cm respectively as seen relative to the wafer edge.

After the metal plate/polymer layer/workpiece/polymer layer laminate is produced, e.g. using one of the previously described exemplary embodiments, and the polymer is cured, as is normal in the references described in the prior art, a thin wafer is separated from the workpiece, e.g. by thermally induced stresses, part of the laminate (in the examples described the second polymer layer or the connection layer) still adhering to one side of the workpiece or wafer. This laminate part can then be separated from the wafer produced e.g. by mechanical or chemical methods, as described in the aforementioned references. The other part of the laminate (in the examples described the first polymer layer or the receiving layer, and on the latter the metal plate or the stabilisation layer) still adheres correspondingly on one side to the remaining workpiece. This part can also be separated e.g. by mechanical or chemical methods, as also described in the aforementioned references. In order to facilitate the detachment of the laminates after the separation of the wafer, it may additionally be helpful to slightly bend the laminate, and this is easily possible in a controlled manner by virtue of the connected metal plate.

According to another preferred embodiment of the present invention the connection layer connects another workpiece or another stabilisation layer to the workpiece, the connection layer having a thickness in the range from 0.1 mm to 20 mm, in particular in a range to 0.2 mm to 10 mm, and the stabilisation layer has a thickness in the range from 0.01 mm to 2 mm, in particular in the range from 0.02 mm to 1 mm.

This embodiment is advantageous because the workpiece can be exposed to forces from a number of, in particular two, sides.

Furthermore, the laminate can preferably be re-used. After the laminate (with or without the metal plate connected) has been separated from the workpiece or wafer produced, it can—if so desired—be cleaned and then be applied to a new workpiece. In this way it is advantageously possible to use the same laminate (with or without the metal plate connected) a number of times in order to produce wafers. This can significantly reduce material consumption and the cost of the whole process. For re-use of the laminate it is particularly advantageous to use a re-soluble adhesive in order to attach the workpiece because in this case, after the adhesive layer on the laminate has dissolved, no adhesive residue remains.

In the exemplary embodiments described it has been shown how layer systems in the form of laminates of polymer layers and layers of other materials (in particular materials with a larger elasticity modulus than the polymers used, i.e. in particular metals) can be used to resolve the problems mentioned at the start in the production of wafers. In order to produce corresponding layer systems, which consist of layers each with different elasticity moduli, one does not, however, necessarily have to combine different materials: It is e.g. also possible to produce polymer layers with different elasticity moduli by processing the polymer used differently (in particular different curing). Moreover, the elasticity modulus of the polymer used is greatly dependent upon the temperature (with a distinct glass transition at approx. −125° C. where the elasticity modulus increases by a number of orders of magnitude). It is therefore also possible, by specifically producing regions/layers with different temperatures in the polymer, to produce corresponding regions/layers with different elasticity moduli. Under certain circumstances, physical values other than the temperature can also affect the elasticity modulus of a corresponding polymer layer locally, and can then be used to specifically produce regions/layers with different elasticity moduli.

Moreover, the layers with different elasticity moduli do not necessarily have to cover the whole surface of the workpiece, but depending on the example of use, configurations where e.g. only a smaller area (e.g. in the middle of the wafer) is covered by a layer with a higher elasticity modulus can also be advantageous. A layer configured as a narrow strip can also be advantageous in order to suppress excessive curvature and oscillations during separation and to thus reduce the thickness variations of the wafers produced.

Another preferred realisation of the present invention consists in particular of adhering laminates to both opposing sides of a thick wafer according to any of the methods described here. In this way the thick wafer can be split into at least or exactly two thin wafers.

According to another preferred embodiment of the present invention the receiving layer preferably comprises a polymer or is made at least partially and particularly preferably entirely of a polymer, when exposing the composite structure, that preferably consists at the very least of the receiving layer and the workpiece, to an inner and/or outer stress field, at least one part, and preferably a number of parts of the polymer, in particular PDMS, undergoing precisely one glass transition, at least one glass transition or a number of glass transitions, in particular temporally staggered glass transitions. It is conceivable here for the initiation of the glass transition to be brought about as a result e.g. of mechanical and/or chemical and/or thermal and/or acoustic effects or exposures.

Furthermore, the invention relates to a device for the production of layers of solid material, in particular wafers. The device according to the invention comprises at least one stressing device for exposing a workpiece to stresses in order to separate a layer of solid material and a carrier unit for receiving at least one layer of solid material, the carrier unit having a stabilisation layer and the stabilisation layer being overlapped at least partially by a receiving layer, the receiving layer being designed to hold the layer of solid material, and the stabilisation layer being at least partially designed such that it has an E modulus that is greater than the E modulus of the receiving layer.

Furthermore, the present invention relates to a carrier unit for receiving at least one layer of solid material, the carrier unit having a stabilisation layer and the stabilisation layer being overlapped at least partially by a receiving layer, the receiving layer being designed to hold the layer of solid material, and the stabilisation layer being at least partially designed such that it has an E modulus that is greater than the E modulus of the receiving layer.

Furthermore, the invention relates to a wafer that is produced by a method according to any of Claims 1 to 13.

Furthermore, the subject matter of publications PCT/US2008/012140 and PCT/EP2009/067539 is made complete by reference to the subject matter of the present patent application. Likewise, the subject matter of two further patent applications also submitted on the application date of the Applicant's present patent application and relating to the domain of the production of layers of solid material are made complete by the subject matter of the present patent application.

The use of the word "substantially" in all cases where this word is used within the framework of the present invention preferably defines a deviation in the range of 1% to 30%, in particular of 1% to 20%, in particular of 1% to 10%, in particular of 1% to 5%, in particular of 1% to 2% from the specification which was given without using this word.

Further advantages, aims and properties of the present invention are explained by means of the following description of the attached drawings in which wafers, carrier units and devices according to the invention are shown as examples. Components or elements of the wafers, carrier units and devices according to the invention which correspond at least substantially with regard to their function in the figures can be identified here by the same reference signs, these components or elements not necessarily being numbered or illustrated in all of the figures.

Individual or all of the illustrations of the figures described below are preferably to be considered as design drawings, i.e. the dimensions, proportions, functional relationships and/or arrangements shown by the figure or figures preferably correspond precisely or preferably substantially to those of the device according to the invention or the product according to the invention.

DETAILED DESCRIPTION

Figure 1A:
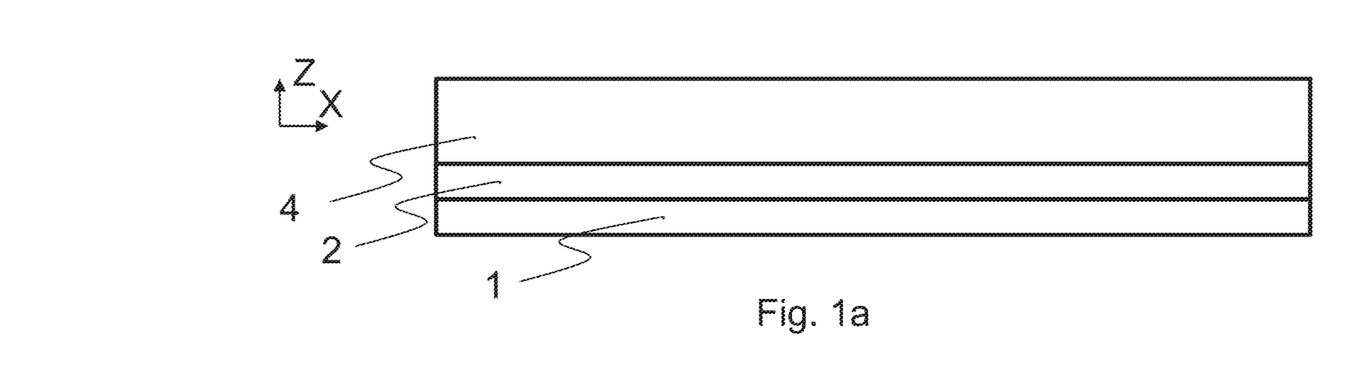
FIG. 1a a first diagrammatic illustration of a layer arrangement according to the subject matter of the present invention.

In FIG. 1a a first diagrammatic cross-sectional illustration of the layer structure according to the invention is shown. According to this illustration the layer structure has at least one stabilisation layer 1, a receiving layer 2 disposed over, against or on the latter, and a workpiece 4 disposed over, against or on the latter.

The individual layers 1, 2, 4 can extend here over the same distance in the X, Y and Z direction, it also being conceivable for only individual layers to extend over the same distance in one or a number of directions. Preferably, the individual layers 1, 2, 4 respectively extend over different distances, at least in the Z direction.

Figure 1B:
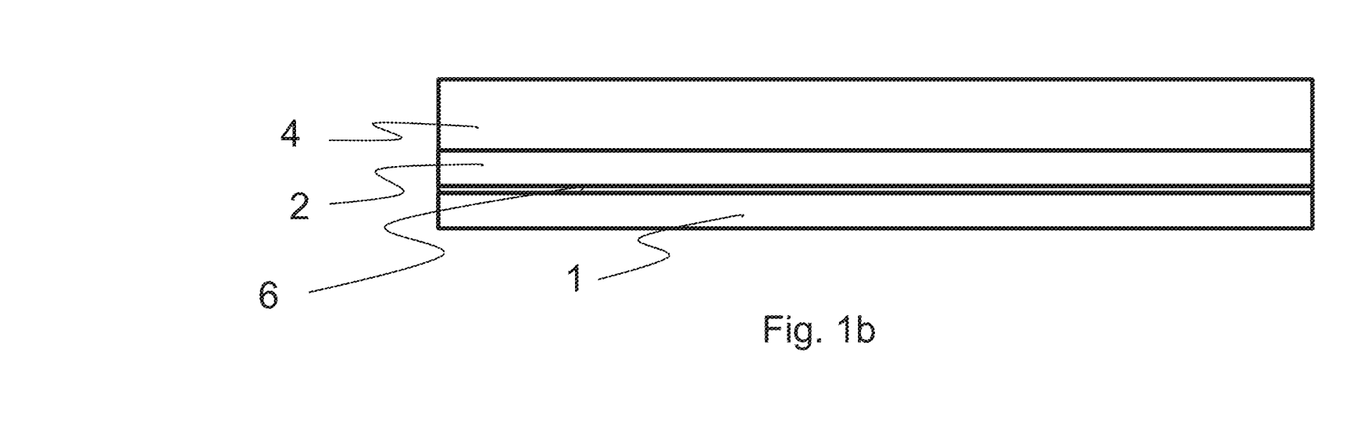
FIG. 1b a second diagrammatic illustration of a layer arrangement according to the subject matter of the present invention.

In FIG. 1b, the layer structure shown in FIG. 1a is supplemented by an adhesive layer 6 that is formed between the stabilisation layer 1 and the receiving layer 2. The adhesive layer 6 can be used to connect the stabilisation layer 1 to the receiving layer 2. However, embodiments are conceivable in which one can dispense with an adhesive layer 6.

Figure 1C:
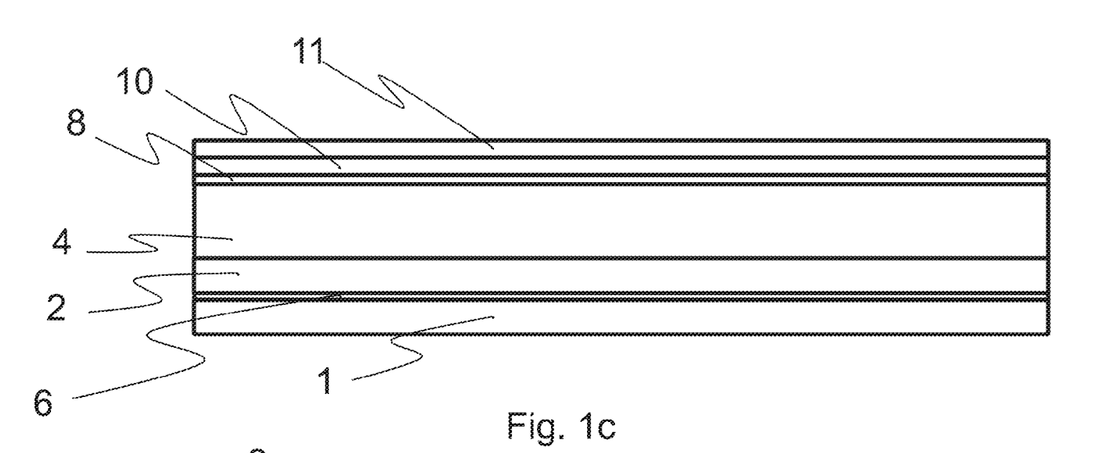
FIG. 1c a third diagrammatic illustration of a layer arrangement according to the subject matter of the present invention.

In FIG. 1c, the layer structure shown in FIG. 1b is supplemented by a connection layer 8, an additional receiving layer 10 and an additional layer 11. The connection layer 8 preferably acts as the adhesive layer 6 here and connects the additional receiving layer 10 to the workpiece 4. Furthermore, there is preferably connected to the additional receiving layer 10 an additional layer 11 which can particularly preferably be made as an additional workpiece 4 or as an additional stabilisation layer, in particular in the form of a metal layer.

Furthermore, it is conceivable for an additional adhesive layer to be provided between the additional receiving layer 10 and the additional layer 11. It is likewise conceivable for the connection layer 8 only to be provided as an option.

Figure 1D:
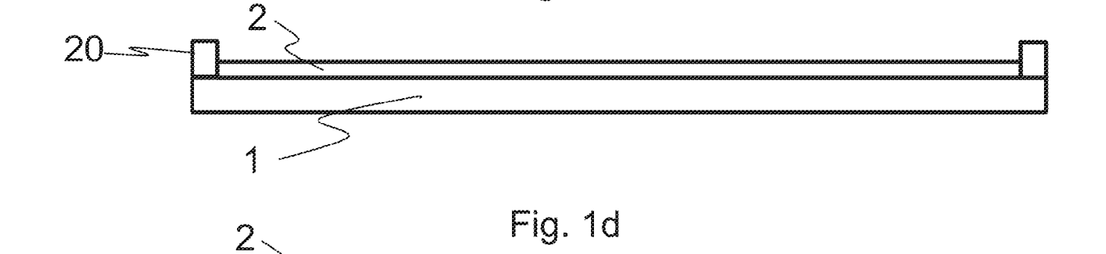
FIG. 1d a first diagrammatic illustration of the production of a receiving layer over a stabilisation layer.

In FIG. 1d a stabilisation layer 1 is shown on which a mounting 20 is disposed. The mounting 20 preferably extends entirely in the circumferential direction of the stabilisation layer 1 and can particularly preferably be brought into contact with the stabilisation layer 1. According to the illustration of FIG. 1d the inner diameter of the mounting 20 is smaller than the outer diameter of the stabilisation layer 1. The internal space defined by the mounting 20 and the stabilisation layer 1 serves to accommodate pourable, in particular liquid material. The material solidifies after being introduced into the internal space such as to form a substantially or exactly level layer, in particular the receiving layer 2.

Figure 1E:
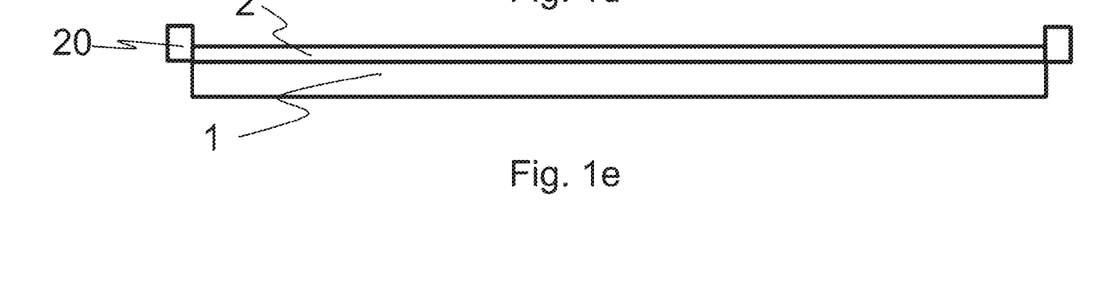
FIG. 1e a second diagrammatic illustration of the production of a receiving layer over a stabilisation layer.

According to FIG. 1e the mounting 20 is larger than in the embodiment shown in FIG. 1d, by means of which the receiving layer 2 produced over the stabilisation layer 1 preferably substantially and particularly preferably completely overlaps the surface of the stabilisation layer 1 extending in the X/Y plane.

Figure 2:
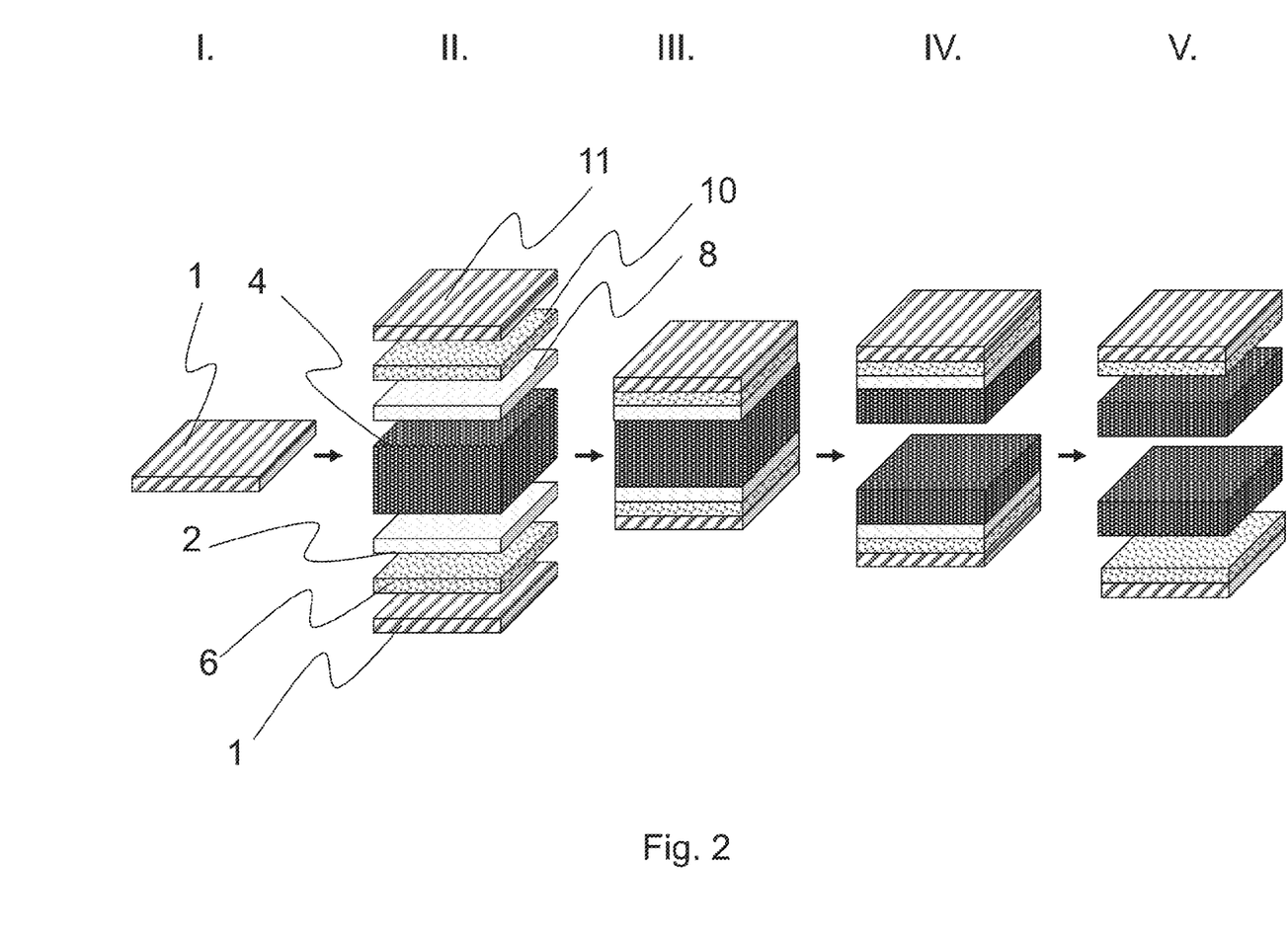
FIG. 2 a diagrammatic illustration of a preferred sequence of the production method according to the invention.

FIG. 2 shows diagrammatically the production of individual layers of solid material from a workpiece in the form of a silicon wafer. In a first step I a first layer is provided, in particular the stabilisation layer 1 which is made from metal, and in particular from aluminium. Furthermore it is conceivable for additional layers 2, 4 to also be provided in this step.

In the second step II additional layers, not yet provided, are produced and/or connected to one another. Preferably, the individual layers are arranged as shown, i.e. an adhesive layer 6 (for example made of PDMS) is preferably applied to the stabilisation layer 1 in order to couple or connect a receiving layer 2 made of PDMS to the stabilisation layer 1. The receiving layer 2 is preferably directly in contact with a workpiece 4, it also being conceivable for a sacrificial layer or an additional adhesive layer to be provided between the receiving layer 2 and the workpiece 4.

The structure described above with the layers 1, 6 and 2 over the workpiece 4 can be applied in the same way to the other side of the workpiece 4 or alternatively be applied in an altered form, as explained in the following. A connection layer 8, in particular in the form of an adhesive, is provided parallel to the receiving layer 2 and preferably also in contact with the workpiece 4. The connection layer 8 can be designed to connect an additional receiving layer 10 made of PDMS and/or an additional layer 11 to the workpiece 4. This additional layer 11 is preferably also made in the form of a stabilisation layer made of metal or of an additional workpiece, a corresponding layer structure composed of the layers 1, 6, 2 or the layers 8, 10, 11 in turn being able to be provided on the additional workpiece. The stabilisation layers 1 are preferably rigid or are made of rigid materials and enable mechanical coupling with an additional device for applying stress. The E modulus of the stabilisation layer 1 or stabilisation layers 1, 11 is therefore higher than the E modulus of the receiving layers 2, 10. Additionally or alternatively, the stabilisation layers 1 enable defined local thermal stressing of the workpiece.

In step III all of the layers are connected to one another or are already connected to one another.

In step IV the workpiece 4 is shown split into two parts, one part of which being connected to the layer arrangement 1, 6, 2, and the other part being connected to the layer arrangement 8, 10, 11. In the transition from step III to step IV locally definable stresses in particular are produced in the workpiece 4, by means of which the workpiece 4 is split into a number of, in particular exactly two parts or layers of solid material. Preferably, mechanical stress is induced into the layer structure by applying forces to more rigid stabilisation layer/s 1, 11. The stress is extremely advantageously induced as a result of the described layer arrangement with layers 1, 6, 2 or 8, 10, 11 with different E moduli because the layers with lower E-moduli can rest against the workpiece 4 without causing any damage, and the layers 1, 11 with higher E-moduli can be coupled to additional devices in order to apply force.

In the optional step V the individual layers of solid material which have been obtained from the workpiece 4 are once again detached from the additional layers.

LIST OF REFERENCE SIGNS 1. stabilisation layer
2. receiving layer
4. workpiece
6. adhesive layer
8. connection layer
10. additional receiving layer
11. additional layer
20. mounting
X width
Y length
Z thickness

The invention claimed is:

1. A method for producing layers of solid material as wafers comprising:
    separating one or more layers of solid material for a workpiece having at least one exposed surface;
    producing and/or providing a carrier unit for receiving at least one layer of the solid material, the carrier unit being made in a number of layers and having a stabilisation layer being overlapped at least partially by a receiving layer, the receiving layer being made to hold the layers of solid material, the stabilisation layer being formed, at least partially, to have an E modulus greater than an E modulus of the receiving layer;
    connecting the receiving layer to the exposed surface of the workpiece to form a composite structure;
    exposing the composite structure to an inner and/or outer stress field such that the layers of solid material is separated along a plane of the workpiece extending within the workpiece; and
    producing and/or providing the receiving layer to include a polymer, exposing the composite structure, consisting of the receiving layer and the workpiece, to an inner and/or outer stress field with at least one part of the polymer undergoing at least one glass transition.

2. The method of claim 1 further comprising producing and/or providing the receiving layer and the stabilisation layer as different materials, the polymer of the receiving layer being a polydimethylsiloxanes (PDMS) polymer and the stabilisation layer being a metal.

3. The method of claim 2 further comprising producing and/or providing the E modulus of the material of the stabilisation layer to be at least twice as great as the E modulus of the material of the receiving layer.

4. The method of claim 1 further comprising producing and/or providing the receiving layer and the stabilisation layer to be firmly bonded to one another.

5. The method of claim 1 further comprising producing and/or providing the receiving layer as a film and the receiving layer to be connected to the stabilisation layer in order to form the carrier unit.

6. The method of claim 5 further comprising producing and/or providing the receiving layer to be connected to the stabilisation layer by an adhesive layer having polydimethylsiloxanes (PDMS), plasma-activated adhesion or lamination.

7. The method of claim 5 further comprising producing and/or providing the receiving layer as surface-structured sufficient to produce locally definable stresses in the workpiece.

8. The method of claim 1 further comprising forming the receiving layer by applying a pourable material onto the stabilisation layer and by solidifying the material.

9. The method of claim 8 further comprising bringing the workpiece into contact with the material before the material solidifies such the workpiece is immersed at least partially in the material.

10. The method of claim 9 further comprising controlling an immersion depth defining immersion of the workpiece at least partially in the material by increasing the normal force exerted upon the carrier unit by the workpiece or by introducing spacers.

11. The method of claim 1 further comprising applying a connection layer of a polymer comprising polydimethylsiloxanes (PDMS) to the workpiece, including arranging the connection layer to be substantially parallel to the receiving layer such that the portions of the connection layer and the receiving layer that are substantially parallel to one another are spaced apart from one another by the workpiece extending in between.

12. The method of claim 11 further comprising applying the connection layer to connect an additional workpiece or an additional stabilisation layer to the workpiece, including producing and/or providing the connection layer with a thickness in a range of 0.2 mm to 10 mm and the stabilisation layer with a thickness in a range of 0.02 mm to 1 mm.

13. A system for producing layers of solid material as wafers, the system being operable for:

separating one or more layers of solid material for a workpiece having at least one exposed surface;

producing and/or providing a carrier unit for receiving at least one layer of the solid material, the carrier unit being made in a number of layers and having a stabilisation layer being overlapped at least partially by a receiving layer, the receiving layer being made to hold the layers of solid material, the stabilisation layer being formed, at least partially, to have an E modulus greater than an E modulus of the receiving layer;

connecting the receiving layer to the exposed surface of the workpiece to form a composite structure;

exposing the composite structure to an inner and/or outer stress field such that the layers of solid material is separated along a plane of the workpiece extending within the workpiece; and producing and/or providing the receiving layer to include a polymer, exposing the composite structure, consisting of the receiving layer and the workpiece, to an inner and/or outer stress field with at least one part of the polymer undergoing at least one glass transition.

14. A wafer produced by the process of:

separating one or more layers of solid material for a workpiece having at least one exposed surface;

producing and/or providing a carrier unit for receiving at least one layer of the solid material, the carrier unit being made in a number of layers and having a stabilisation layer being overlapped at least partially by a receiving layer, the receiving layer being made to hold the layers of solid material, the stabilisation layer being formed, at least partially, to have an E modulus greater than an E modulus of the receiving layer;

connecting the receiving layer to the exposed surface of the workpiece to form a composite structure;

exposing the composite structure to an inner and/or outer stress field such that the layers of solid material is separated along a plane of the workpiece extending within the workpiece; and producing and/or providing the receiving layer to include a polymer, exposing the composite structure, consisting of the receiving layer and the workpiece, to an inner and/or outer stress field with at least one part of the polymer undergoing at least one glass transition.

* * * * *